(12) United States Patent
Suzuki (10) Patent No.: US 7,504,710 B2
(45) Date of Patent: Mar. 17, 2009

(54) MULTILAYER DIELECTRIC SUBSTRATE AND SEMICONDUCTOR PACKAGE

(75) Inventor: Takuya Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 116 days.

(21) Appl. No.: 11/630,996

(22) PCT Filed: Jun. 24, 2005

(86) PCT No.: PCT/JP2005/011650

§ 371 (c)(1),
(2), (4) Date: Dec. 28, 2006

(87) PCT Pub. No.: WO2006/001389

PCT Pub. Date: Jan. 5, 2006

(65) Prior Publication Data
US 2007/0273008 A1    Nov. 29, 2007

(30) Foreign Application Priority Data
Jun. 28, 2004    (JP) .............................. 2004-190316

(51) Int. Cl.
*H01L 29/00*    (2006.01)
*H01L 23/552*    (2006.01)
(52) U.S. Cl. ................. 257/659; 257/528; 257/536
(58) Field of Classification Search ......... 257/528–543, 257/659–660
See application file for complete search history.

(56) References Cited

U.S. PATENT DOCUMENTS

| | | | | |
|---|---|---|---|---|
| 6,239,669 | B1 * | 5/2001 | Koriyama et al. | 333/26 |
| 2003/0189246 | A1 * | 10/2003 | Iwaki et al. | 257/706 |
| 2007/0132094 | A1 * | 6/2007 | Shimura et al. | 257/729 |

FOREIGN PATENT DOCUMENTS

| | | |
|---|---|---|
| JP | 8 18310 | 1/1996 |
| JP | 11 112209 | 4/1999 |
| JP | 2001 196500 | 7/2001 |
| JP | 2002-208807 | 7/2002 |
| JP | 2003 78310 | 3/2003 |

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

A multilayer dielectric substrate that mounts a semiconductor device in a cavity formed on a substrate. The multilayer dielectric substrate includes an opening formed in a surface-layer grounding conductor on the substrate in the cavity, and an impedance transformer, with a length of about ¼ of an in-substrate effective wavelength of a signal wave, electrically connected through the opening to the cavity. The multilayer dielectric substrate further includes a short-circuited end dielectric transmission line with a length of about ¼ of the in-substrate effective wavelength of the signal wave, a coupling opening formed on an inner-layer grounding conductor in a connecting section of the impedance transformer and the dielectric transmission line, and a resistor formed in the coupling opening.

7 Claims, 11 Drawing Sheets

SURFACE LAYER
(SURFACE D)

FIG.7D

SURFACE C

FIG.7E

SURFACE A

MULTILAYER DIELECTRIC SUBSTRATE AND SEMICONDUCTOR PACKAGE

TECHNICAL FIELD

The present invention relates to a multilayer dielectric substrate and a semiconductor package that includes an electromagnetically shielded space (hereinafter, "cavity") for mounting a semiconductor device, which operates in a high-frequency band such as a microwave band or a millimeter-wave band, formed on a dielectric substrate.

BACKGROUND ART

In a high-frequency package mounted with a high-frequency semiconductor device, which operates in a high-frequency band such as a microwave band or a millimeter-wave band, in consideration of environmental resistance and operation stability of the high-frequency package, the high-frequency semiconductor device is often mounted in a cavity hermetically and electrically shielded by a cover, a seal ring, or a grounding conductor.

However, resonance occurs in a frequency band with a cavity dimension, which depends on a member such as the cover, about a half or an integer times as long as that of a free-space propagation wavelength. As a result, an operation of the semiconductor device in the cavity and a characteristic of a transmission line become unstable. Particularly, in a high-frequency semiconductor device that operates in a millimeter-wave band (30 gigahertz to 300 gigahertz), a dimension of the device and that of a propagation wavelength corresponding to a signal frequency come close to each other. Thus, it is difficult to make a dimension of the cavity for housing the device a half or less of the propagation wavelength corresponding to the signal frequency. Consequently, a high-order resonance mode tends to occur. In particular, in a millimeter-wave radar that operates in a 76-GHz band, a free-space propagation wavelength is about 4 millimeters in this frequency band and a size of a cavity necessary for mounting a plurality of high-frequency circuits with a size of 1 millimeter square to 3 millimeters square is about 10 millimeters. Thus, cavity resonance is likely to occur.

To control such cavity resonance, Patent Document 1 discloses a conventional technology for forming a radio wave absorbent and a resistor film in a region inside a cavity such as a rear surface of a cover.

Patent Document 1: Japanese Patent Application Laid-open No. H8-18310

DISCLOSURE OF INVENTION

Problem to be Solved by the Invention

In the conventional technology, a dedicated cover bonded with a radio wave absorbent and a resistor is required, which necessitates secondary assembly work of bonding the resistor to the cover. Thus, the number of manufacturing steps increases, resulting in an increase in manufacturing cost. Further, the resistor applied to the entire cover increases material cost of the resistor. Besides, it is likely that an inert gas, which contaminates and erodes the high-frequency device, is generated from an adhesive for bonding the radio wave absorbent and the resistor to the rear surface of the cover. Moreover, the resistor is arranged vertically to an electric field in the cavity, and efficiency of absorption of electromagnetic waves is low.

It is therefore an object of the present invention to provide a multilayer dielectric substrate and a semiconductor package at low cost that improves efficiency of absorption of electromagnetic waves to control cavity resonance in a hermetic package as well as simplifying a manufacturing process.

Means for Solving Problem

To overcome the problems and achieve the object mentioned above, according to the first aspect of the present invention, a multilayer dielectric substrate in which a cavity is formed on a dielectric substrate and a semiconductor device is mounted in the cavity, includes an opening formed in a surface-layer grounding conductor arranged on the dielectric substrate in the cavity, an impedance transformer formed in the dielectric substrate, electrically coupled with the cavity via the opening, and having a length an odd number times as long as about ¼ of an in-substrate effective wavelength of a signal wave, a short-circuited-end dielectric transmission line formed in the dielectric substrate and having a length an odd number times as long as about ¼ of the in-substrate effective wavelength of the signal wave, a coupling opening formed in an inner-layer grounding conductor in a connecting section of the impedance transformer and the dielectric transmission line, and a resistor formed in the coupling opening.

According to the first aspect of the present invention, a state equivalent to an open state without a cover is simulatively created by forming a terminating waveguide, which is coupled with a cavity, to suppress cavity resonance. That is, an opening (removed part of a surface-layer grounding conductor) is formed at a cavity end of a surface-layer grounding conductor on a dielectric substrate or the periphery of the end. An impedance transformer with a length an odd number times as long as about ¼ of an in-substrate effective wavelength $\lambda g$ of a signal wave is formed in the dielectric substrate beyond this opening. A coupling opening is formed on an inner-layer grounding conductor at the tip of the impedance transformer, i.e., at a position distant from the opening by a length an odd number times as long as about $\lambda g/4$ in a thickness direction of the substrate. A resistor (printed resistor) is formed to cover the coupling opening. A characteristic impedance of the impedance transformer is set to a value that converts impedance of the resistor and the cavity. A short-circuited-end dielectric transmission line having a length an odd number times as long as about ¼ of the in-substrate effective wavelength $\lambda g$ of the signal wave is formed in the coupling opening, i.e., beyond the resistor. An electric field distribution in the coupling opening is open according to a short-circuit load condition of the dielectric transmission line. The resistor is arranged at the maximum point of the electric field in parallel to an electric field direction.

According to the second aspect of the present invention, a multilayer dielectric substrate in which a cavity is formed on a dielectric substrate and a semiconductor device is mounted in the cavity, includes an opening formed at a cavity end of a surface-layer grounding conductor on a dielectric substrate in the cavity or the periphery of the end, a short-circuited-end dielectric transmission line formed in the dielectric substrate, electrically coupled with the cavity via the opening, and having a length an odd number times as long as about ¼ of an in-substrate effective wavelength of a signal wave, and a resistor formed in the opening.

According to the second aspect of the present invention, a state equivalent to an open cavity state is simulatively created by forming a terminating waveguide, which is coupled with a cavity, to suppress cavity resonance. That is, an opening (removed part of a surface-layer grounding conductor) is formed at a cavity end of a surface-layer grounding conductor on a dielectric substrate or the periphery of the end. A short-circuited-end dielectric transmission line with a length an odd number times as long as about ¼ of an in-substrate effective wavelength of a signal wave, which is electrically coupled with the cavity, is formed in a dielectric substrate beyond the opening. An electric field distribution in the opening is open according to a short-circuit load condition of the dielectric transmission line. The resistor is arranged at the maximum point of the electric field in parallel to an electric field direction.

EFFECT OF THE INVENTION

According to the first aspect of the present invention, it is possible to realize, with the impedance transformer, impedance transformation with less reflection from the cavity, i.e., a hollow waveguide, to a resistance load. An electric field in the coupling opening is maximized (brought to an open point) by the short-circuited-end dielectric transmission line. Thus, it is possible to obtain maximum attenuation and absorption effects from the resistor with respect to the signal frequency band. With the terminating conditions, it is possible to reliably control cavity resonance and achieve stable operations of a semiconductor device and a transmission line. Besides, the opening, the dielectric transmission line, and the resistor can be formed together during the manufacture of the multilayer dielectric substrate, which eliminates the need for secondary assembly work. Thus, it is possible to simplify manufacturing process, resulting in less cost. Moreover, an adhesive is not used in arranging the resistor, an inert gas, which contaminates and erodes a high-frequency device, is not generated.

According to the second aspect of the present invention, an electric field in the coupling opening is maximized (brought to an open point) by the short-circuited-end dielectric transmission line. Thus, it is possible to obtain maximum attenuation and absorption effects from the resistor with respect to the signal frequency band. Therefore, it is possible to control cavity resonance and achieve stable operations of a semiconductor device and a transmission line.

EXPLANATIONS OF LETTERS OR NUMERALS

1 High-frequency package (Semiconductor package)
2 Multilayer dielectric substrate
3 High-frequency device (Semiconductor device)
4 Seal ring
5 Cover
6 IC mounting recess
6a Sidewall
7 Feed-through
8 Microstrip line
10 Inner conductor pad
11 Conductor pad
12 Wire
15 External conductor pad
16 Ground surface (Surface-layer grounding conductor)
18 Ground pattern (Surface-layer grounding conductor)
19 Dielectric
30 Ground via
30b Sidewall ground via
33 Cavity
35 Inner-layer grounding conductor
40 Signal via
45 Inner-layer signal line
50 Opening
60 Impedance transformer
65 Coupling opening
70 Resistor
80 Dielectric transmission line
300 Resistor via array Best Mode(s) for Carrying out the Invention Embodiments of a multilayer dielectric substrate and a semiconductor package according to the present invention are explained in detail below with reference to the accompanying drawings. However, the present invention is not limited to the embodiments.

First Embodiment

Figure 1:
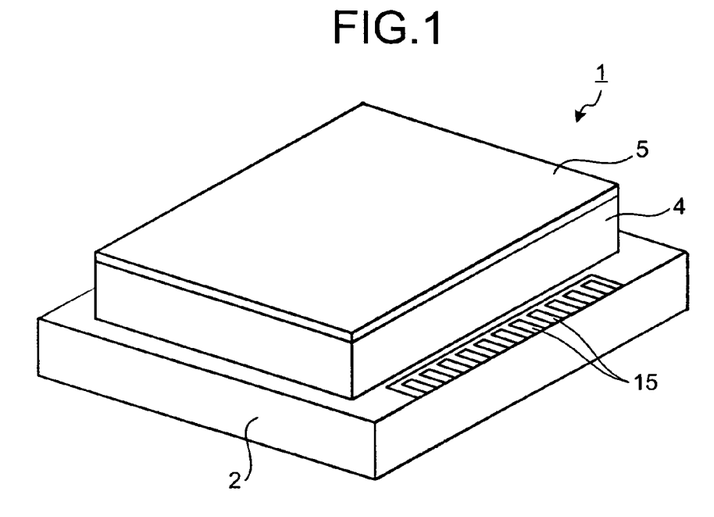
FIG. 1 is a perspective view of an external appearance of a semiconductor package (high-frequency package) according to the present invention.
Figure 2:
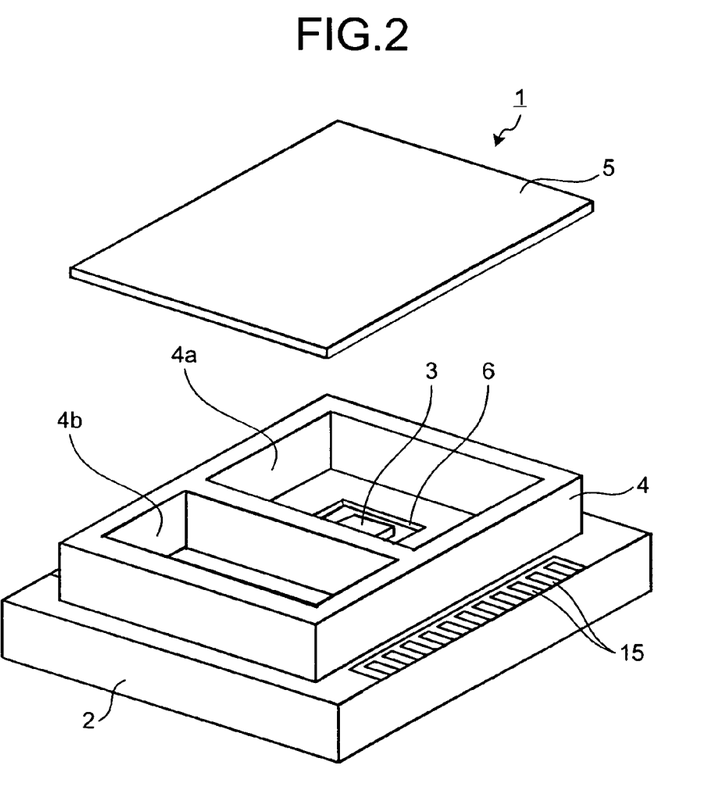
FIG. 2 is a perspective view of an external appearance of the semiconductor package with a cover removed.
Figure 3:
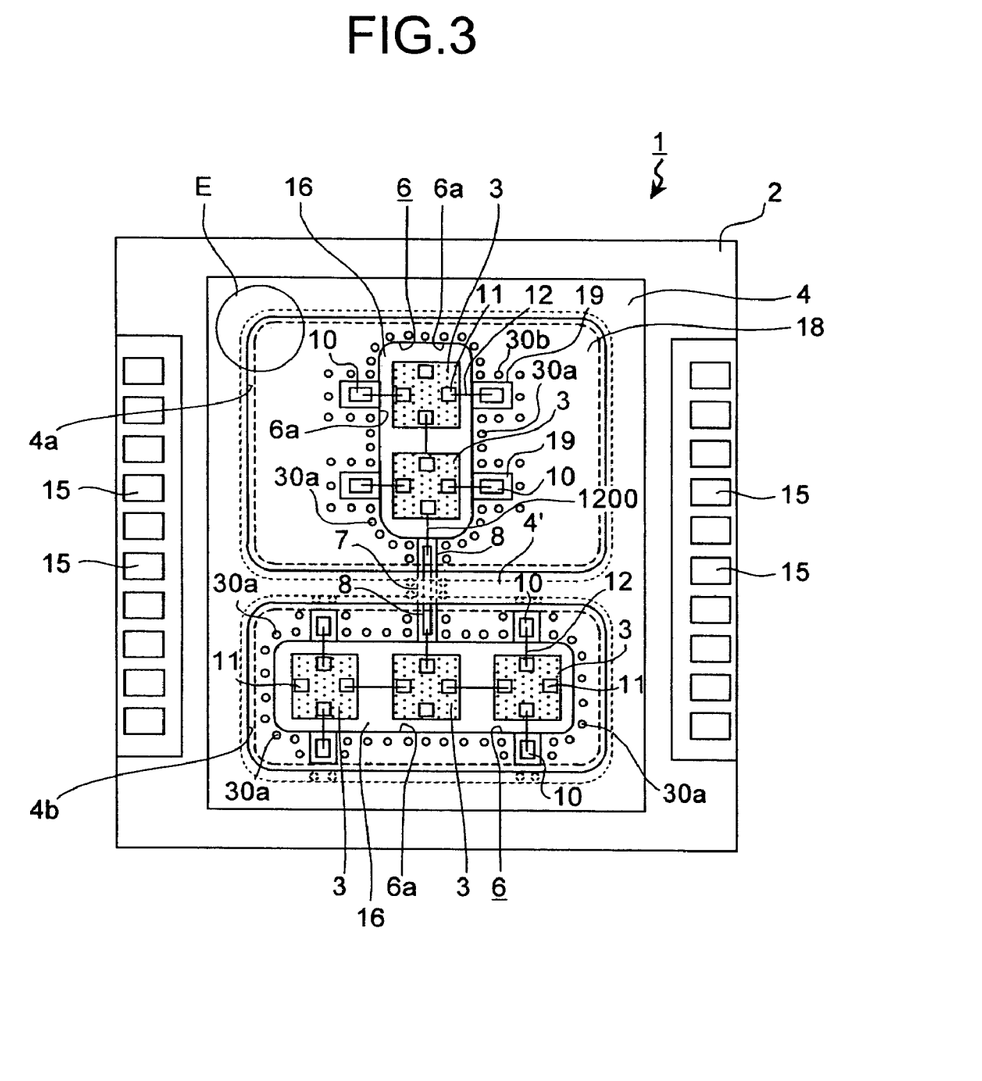
FIG. 3 is a plan view of an internal structure of the semiconductor package.

FIGS. 1 to 3 are diagrams of a semiconductor package 1 according to the present invention. The present invention is applicable to a semiconductor package mounted with a semiconductor device (semiconductor IC) that operates in an arbitrary frequency band. In the following description, the present invention is applied to the semiconductor package 1 (hereinafter, "high-frequency package") mounted with a plurality of high-frequency semiconductor devices (monolithic microwave integrated circuit (MMIC), hereinafter, "high-frequency device") that operate in a high frequency band such as a microwave band or a millimeter-wave band. In the semiconductor package 1, a hermetically and electrically shielded cavity is formed on a dielectric substrate. A multilayer dielectric substrate 2 mounted with a semiconductor device is provided in the cavity. The semiconductor package 1 is suitably applied to, for example, a frequency-modulation continuous-wave (FM-CW) radar.

In the high-frequency package 1 shown in FIGS. 1 to 3, a frame-shaped seal ring 4 of metal is bonded on the multilayer dielectric substrate 2 by a brazing material such as solder or silver solder. A cover 5 serving as a lid is welded on the seal ring 4. In an example of FIG. 1, the seal ring 4 is a frame of a figure-eight-like shape with two through-holes 4a and 4b.

By bonding the cover 5 to the seal ring 4, a plurality of high-frequency devices 3 on the multilayer dielectric substrate 2 are hermetically sealed. The seal ring 4 and the cover 5 shield unnecessary radiation from the high-frequency devices 3 on the multilayer dielectric substrate 2 to the outside. In other words, the seal ring 4 and the cover 5 constitute an electromagnetic shielding member that covers a part of a surface layer of the multilayer dielectric substrate 2 and the high-frequency devices 3. A structure of the electromagnetic shield is not limited to this. The electromagnetic shield includes various components such as a grounding conductor and a plurality of grounded vias, described later, provided on the surface and inner layers of the multilayer dielectric substrate 2.

As shown in FIGS. 2 and 3, one to a plurality of recesses (hereinafter, "IC mounting recesses") 6 for mounting the high-frequency devices 3 are formed on the multilayer dielectric substrate 2. The IC mounting recess forms a hollowed out section in upper layers (first and second layers in an example of the figures) of the multilayer dielectric substrate 2. The hollowed out section is surrounded by a sidewall 6a of the IC mounting recess 6. A grounding conductor 16 is formed on a bottom surface of the IC mounting recess (bottom surface of the hollowed out section). The high-frequency devices 3 are housed in the IC mounting recess 6. The high-frequency devices 3 are bonded to the grounding conductor 16 by a bonding material (not shown) such as solder or brazing material.

As shown in FIG. 3, the IC mounting recesses 6 are arranged inside the two through-holes 4a and 4b of the seal ring 4, respectively. A feed-through 7 is provided below a seal ring 4' that defines the two through-holes 4a and 4b of the seal ring 4. The high-frequency devices 3 in the IC mounting recess 6 on the upper side and the high-frequency devices 3 in the IC mounting recess 6 on the lower side are connected by the feed-through 7 and a microstrip line 8. The feed-through 7 is formed to cover a signal pin or the microstrip line with a dielectric. Consequently, a high-frequency signal is transmitted between the two IC mounting recesses 6 while a hermetic state is maintained in the respective IC mounting recesses 6. The microstrip line 8 is arranged on the surface layer of the multilayer dielectric substrate 2 and connected to the feed-through 7. A conductor pad in the high-frequency device 3 and the microstrip line 8 are wire-bonded by a wire 1200.

Figure 6:
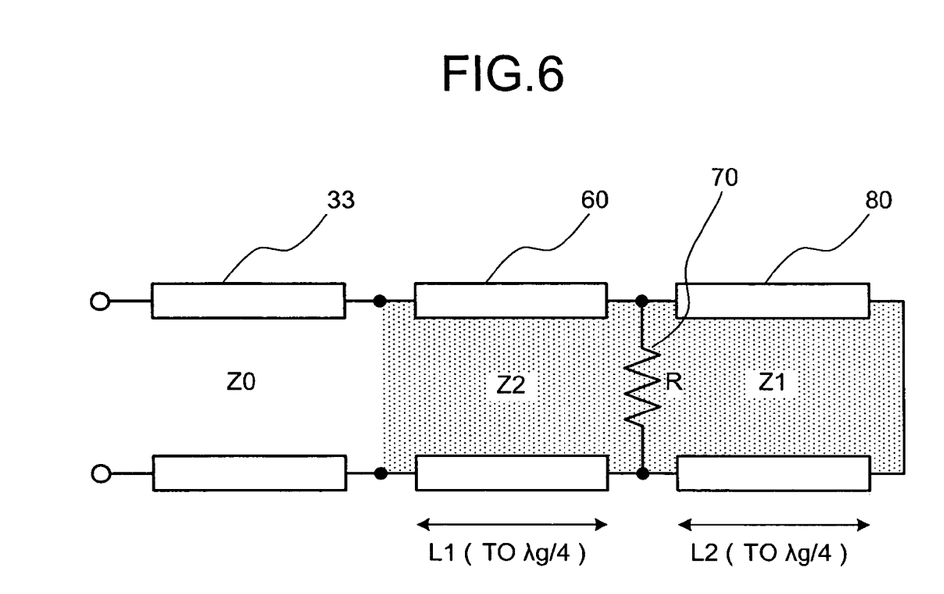
FIG. 6 is a diagram of an equivalent circuit of a resonance suppressing circuit.

Grounding conductors 18 on the surface layer of the multilayer dielectric substrate 2 are connected to the grounding conductor 16 on the semiconductor device mounting surface by a plurality of ground vias (sidewall ground vias) 30a and 30b formed around the IC mounting recess 6 in the multilayer dielectric substrate 2. The grounding conductors 18 have the same potential as that of the grounding conductor 16. The ground vias 30a and 30b surround conductor pads 10 (described later). Other ground vias (sidewall ground vias) 30, described later referring to FIG. 6, are arranged along the inner circumferential surface of the two through-holes 4a and 4b of the seal ring 4. The ground vias 30 are connected to the grounding conductors 18 and have the same potential as that of the grounding conductors 18.

Spacing between these sidewall ground vias 30a, 30b, and 30 is set to a value smaller than a half of an in-substrate effective wavelength $\lambda g$ of a high-frequency signal, which is an unnecessary wave, used in the high-frequency package 1. Consequently, the unnecessary wave is prevented from entering the multilayer dielectric substrate 2 via the sidewall 6a of the IC mounting recess 6, and an electromagnetic shield is three-dimensionally formed by the seal ring 4 and the cover 5.

The conductor pads (hereinafter, "inner conductor pads") 10 are provided on the surface layer of the multilayer dielectric substrate 2 inside the seal ring 4 for supplying a DC bias voltage to the high-frequency devices 3 or inputting and outputting a control signal (low-frequency signal close to a DC region) and an IF signal (signal in an intermediate frequency band) to and from the high-frequency devices 3. The DC bias voltage, the control signal, and the IF signal are hereinafter generally referred to as "driving control signal" for the high-frequency devices 3. Driving-control-signal input/output pads 11 (hereinafter, "conductor pads") are also provided on the high-frequency device 3 side. The inner conductor pad 10 and the conductor pad 11 are wire-bonded by a wire 12 of gold or the like. A metal bump or a ribbon can be used instead of the wires 12.

A plurality of conductor pads (hereinafter, "external conductor pads") 15 are provided as external terminals on the multilayer dielectric substrate 2 outside the seal ring 4. The external conductor pads 15 are DC-connected to the inner conductor pads 10 via signal vias (signal through-holes) and an inner-layer signal line, described later, formed in the multilayer dielectric substrate 2. These external conductor pads 15 are connected to a power source circuit board, a control board and the like, which are not shown in the figures, via wires or the like.

Figure 4:
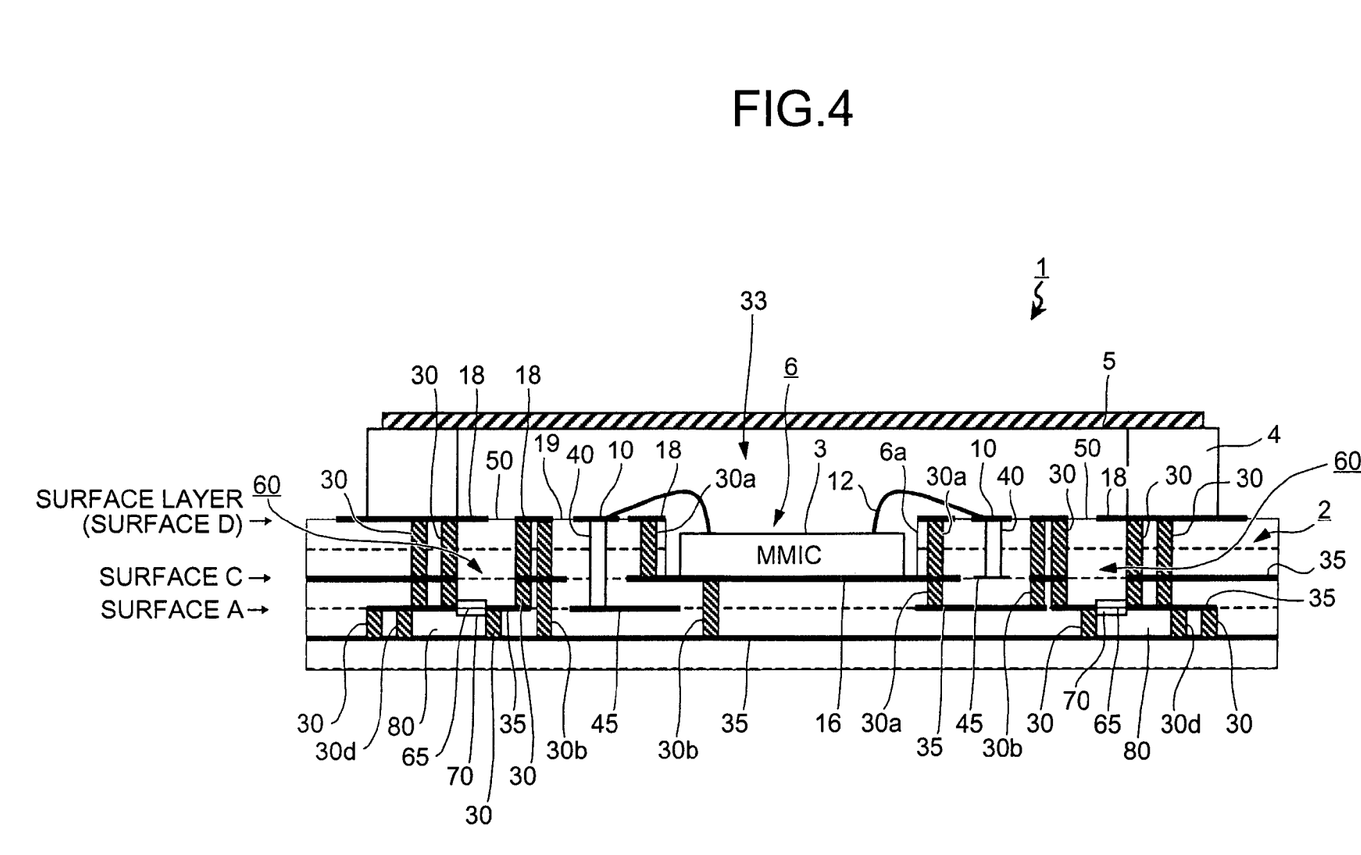
FIG. 4 is a detailed sectional view of an internal layer structure of a multilayer dielectric substrate of a semiconductor package according to a first embodiment of the present invention.

FIG. 4 is a diagram of a via structure (through-hole structure) in the multilayer dielectric substrate 2 of the high-frequency package 1. In FIG. 4, vias for driving control signals (hereinafter, "signal vias") 40, to which driving control signals such as a control signal, an interface signal, and a DC bias voltage are transmitted, are indicated by outline without fill patterns and the ground vias 30, 30a, and 30b are indicated by hatching.

In this case, the multilayer dielectric substrate 2 has a five-layer structure including first to fifth layers. The center of the first and the second layers of the multilayer dielectric substrate 2 is removed to form the IC mounting recess 6. The ground surface 16 serving as a surface-layer grounding conductor is formed on the bottom surface of the IC mounting recess 6, i.e., the surface of the third layer. The high-frequency devices 3 are mounted on the ground surface 16.

As described above, the seal ring 4 is mounted on the multilayer dielectric substrate 2. The cover 5 serving as a lid is provided on the seal ring 4. The seal ring 4 and the cover 5 have the same potential as that of the surface-layer grounding conductors 16 and 18. A hermetic cavity 33 is formed by the seal ring 4 and the cover 5 around the high-frequency devices 3 on the multilayer dielectric substrate 2. The cavity 33 is electrically shielded from the outside by the electromagnetic shielding members such as the seal ring 4 and the cover 5, the surface-layer grounding conductors such as the ground surface 16 and ground pattern 18, and the sidewall ground vias 30a, 30b, and 30. Instead of the sidewall ground vias 30a and 30b, the sidewall 6a of the IC mounting recess 6 can be metallized to form a ground surface on the sidewall 6a.

The ground vias 30, 30a, and 30b are appropriately connected to the surface-layer grounding conductors 18, a grounding member (not shown) arranged below the multilayer dielectric substrate 2, or inner-layer grounding conductors 35 formed on inner layers of the multilayer dielectric substrate 2. The inner-layer grounding conductors 35 are basically provided individually among all the layers as solid ground layers. The inner conductor pad 10 inside the seal ring 4 is connected to the external conductor pads 15 (not shown in FIG. 4) arranged outside the seal ring 4 via one to a plurality of the signal vias 40 and one to a plurality of inner-layer signal lines 45. Although not clearly shown in FIG. 4, the ground vias 30 are arranged around the signal via 40 and the inner-layer signal line 45 with a dielectric therebetween. Shield by the ground vias 30 and the inner-layer grounding conductors 35 suppresses radiation of unnecessary waves from the signal vias 40 and the inner-layer signal lines 45 and coupling of unnecessary waves from the surroundings.

A main part of the first embodiment is explained. In the first embodiment, a cavity-resonance control circuit that includes an opening 50, an impedance transformer 60, a coupling opening 65, a short-circuited-end dielectric transmission line 80, and a resistor 70 is formed in the multilayer dielectric substrate 2.

The opening 50, i.e., a pattern removed from a ground, is formed at a cavity end of the ground pattern 18 as a surface-layer grounding conductor on the surface (the first layer) of the multilayer dielectric substrate 2 or the periphery of the end. The impedance transformer 60 with a length about ¼ of an in-substrate effective wavelength $\lambda g$ of a signal wave, which is electrically coupled to the cavity 33 (i.e., a hollow waveguide) via the opening 50, is formed in the multilayer dielectric substrate 2 beyond the opening 50. The impedance transformer 60 includes the inner-layer grounding conductor 35, the ground via 30, and the dielectrics in the inner-layer grounding conductor 35 and the ground via 30.

Figure 5:
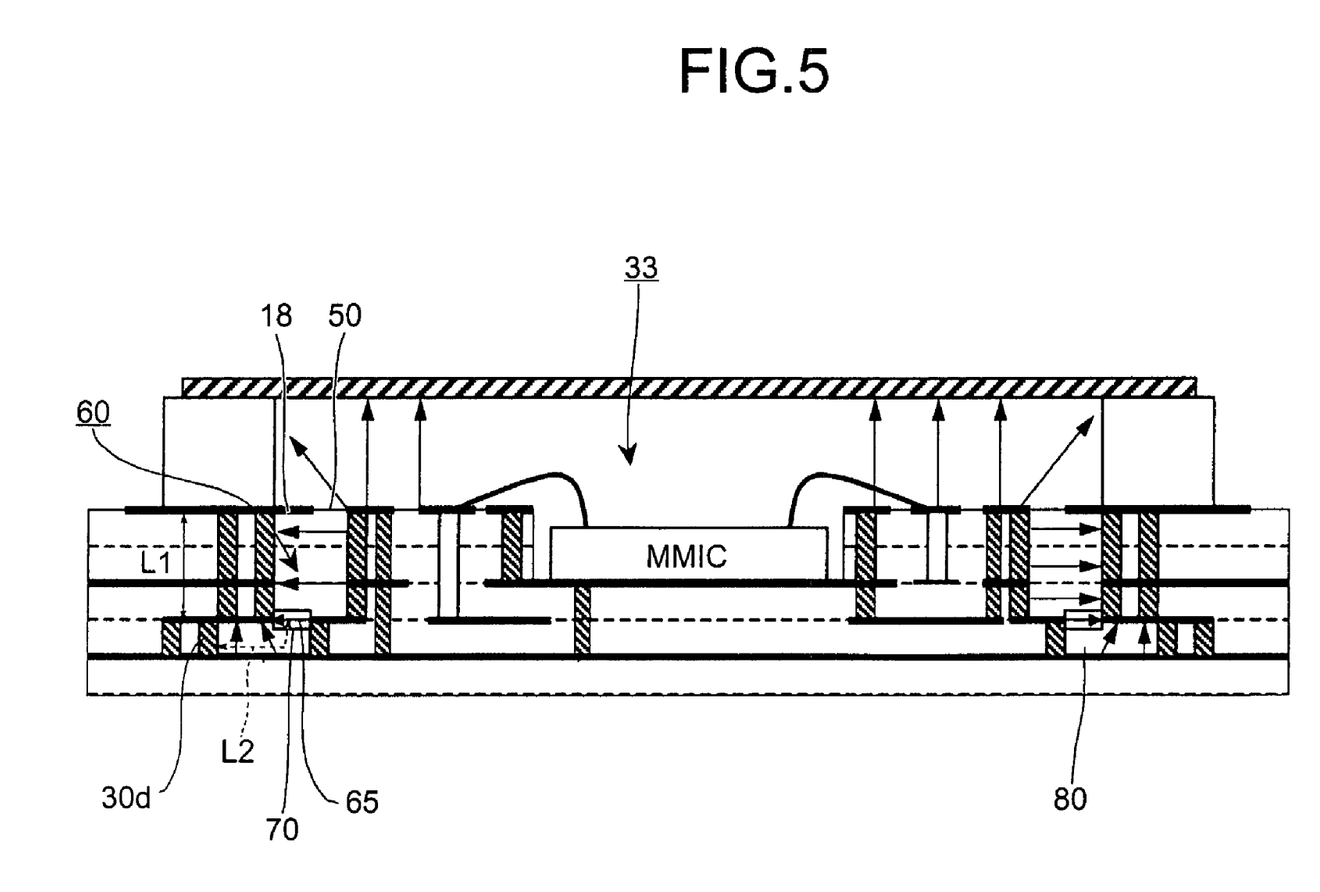
FIG. 5 is a sectional view of the internal layer structure of the multilayer dielectric substrate shown in FIG. 4 with an electric field distribution.

The coupling opening 65, i.e., a pattern removed from a ground, is formed in the inner-layer grounding conductor 35 arranged at a position distant from the opening 50 by a length of about $\lambda g/4$ in the thickness direction of the substrate. The resistor (printed resistor) 70 is formed to cover the coupling opening 65. The short-circuited-end dielectric transmission line 80 with a length about ¼ of the in-substrate effective wavelength $\lambda g$ of a signal wave is formed beyond the coupling opening 65. The dielectric transmission line 80 includes the inner-layer grounding conductor 35, the ground vias 30 and 30d, and dielectrics in the inner-layer grounding conductor 35 and the ground vias 30. The dielectric transmission line 80 functions as a dielectric waveguide having a short-circuited surface (surface on which the ground via 30d is arranged) at the end thereof. The length of about $\lambda g/4$ in the dielectric transmission line 80 is, as shown in FIG. 5, a distance L2 from the short-circuited-end ground via 30d to the coupling opening 65. The length of about $\lambda g/4$ of the impedance transformer 60 is, as shown in FIG. 5, a distance L1 from the opening 50 to the coupling opening 65. FIG. 5 depicts the same structure as that of FIG. 4, and reference numerals are omitted except those necessary for explanation.

On the other hand, when stable operations of a semiconductor device and a transmission line are considered, a state in which the cover 5 is removed (open state) is ideal because there is no unnecessary resonance in the cavity. In the first embodiment, the opening 50 is formed at the cavity end of the ground pattern 18 or the periphery of the end. The impedance transformer 60 and the resistor 70 are connected to the multilayer dielectric substrate 2 beyond the opening 50. It is impossible to realize an open end in the waveguide, and therefore, the dielectric transmission line 80 is connected to the impedance transformer 60 and the resistor 70 is provided in the position about $\lambda g/4$ from the end short-circuited point of the dielectric transmission line 80, i.e., in the coupling opening 65, which connects the impedance transformer 60 and the dielectric transmission line 80. In other words, the position about $\lambda g/4$ from the end short-circuited point of the dielectric transmission line 80 is, for the signal wave with the in-substrate effective wavelength $\lambda g$, an open point where an electric field is maximized. The resistor 70 is provided in the open point. With this constitution, the multilayer dielectric substrate 2 can operate as a terminator that efficiently attenuates and absorbs radio waves in the signal frequency band and control cavity resonance to achieve stable operations of a semiconductor device and a transmission line.

An electric field distribution formed in the cavity 33, the impedance transformers 60, and the dielectric transmission lines 80 is as indicated by arrows in FIG. 5. In FIG. 5, the resistor 70 is arranged in parallel to an electric field surface formed in the coupling opening 65. Therefore, it is possible to efficiently attenuate and absorb radio waves compared to the conventional technology in which a resistor is arranged perpendicular to an electric filed formed in a cavity.

An equivalent circuit of a resonance suppressing circuit is explained with reference to FIG. 6. As a characteristic impedance Z2 of the impedance transformer 60 is selected a (impedance match) value that satisfies $Z2=(Z0 \cdot R)^{1/2}$ where Z0 is a characteristic impedance of the cavity 33 and R is a resistance of the resistor 70. When the impedance transformer 60 as above is inserted, it is possible to improve a reflection characteristic, i.e., attenuation and absorption effects by the resistor 70, compared to the case that the resistor 70 is directly provided in the opening 50 on the cavity 33 side.

A characteristic impedance Z1 of the dielectric transmission line 80 is, desirably but not necessarily, coincide with a terminating impedance R of a resistor; an open condition in the coupling opening 65 only has to be fulfilled. In the reflection characteristic of the resonance suppressing circuit, a reactance component of a high-order mode is generated by a dielectric constant difference between the cavity 33 (the hollow waveguide) and the impedance transformer 60 (the dielectric transmission line) and the impedance match state changes. To solve this problem, an iris (inductivity, capacitivity) or the like for canceling reactance can be set in the inner-layer grounding conductor 35 constituting the impedance transformer 60. Further, to cancel the reactance, the characteristic impedance Z2 and the effective length L1 of the impedance transformer 60 can be corrected to improve the reflection characteristic of the entire resonance suppressing circuit.

Figure 7A:
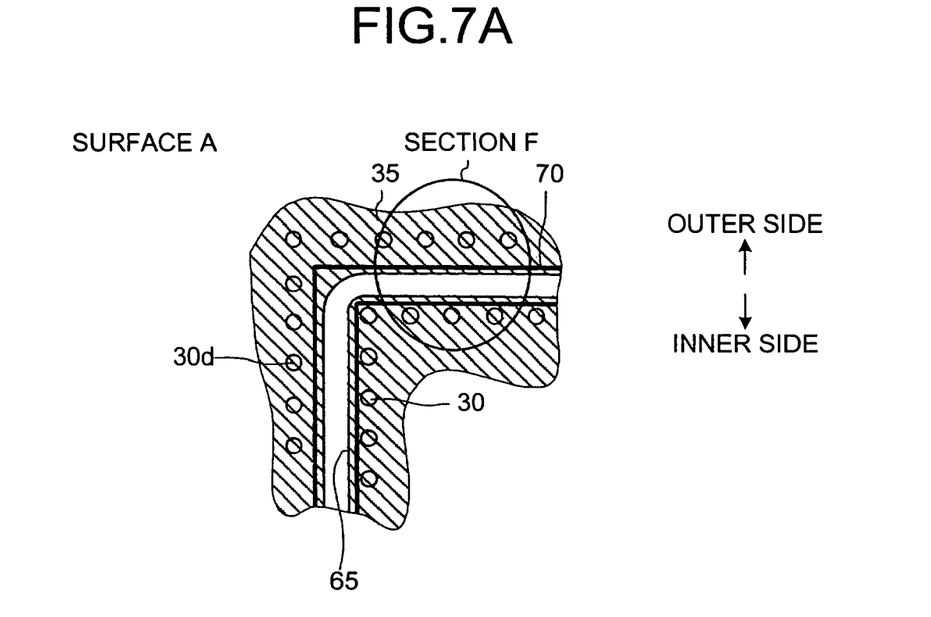
FIG. 7A is a plan view of details of a part in the multilayer dielectric substrate and is a diagram of a state of a surface A of the multilayer dielectric substrate shown in FIG. 4.
Figure 7B:
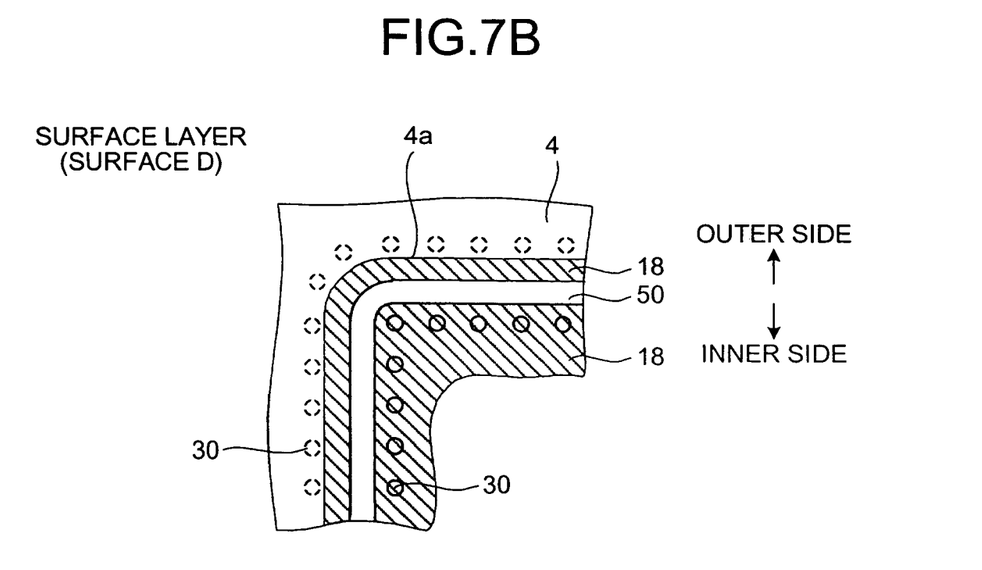
FIG. 7B is a plan view of details of a part in the multilayer dielectric substrate and is a diagram of a surface structure of the multilayer dielectric substrate shown in FIG. 4.
Figure 7C:
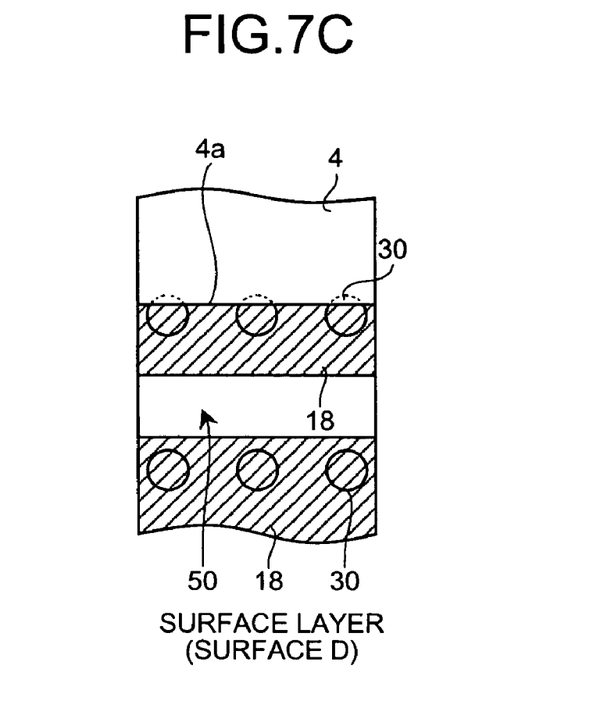
FIG. 7C is a plan view of details of a region corresponding to a section F in FIG. 7A and is a diagram of a surface structure of the multilayer dielectric substrate shown in FIG. 4.
Figure 7D:
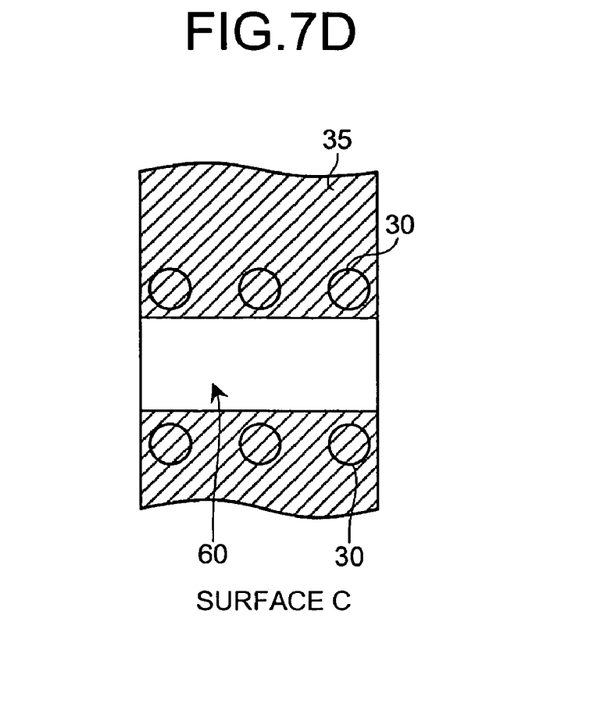
FIG. 7D is a plan view of details of the region corresponding to the section F in FIG. 7A and is a diagram of a state of a surface C of the multilayer dielectric substrate shown in FIG. 4.
Figure 7E:
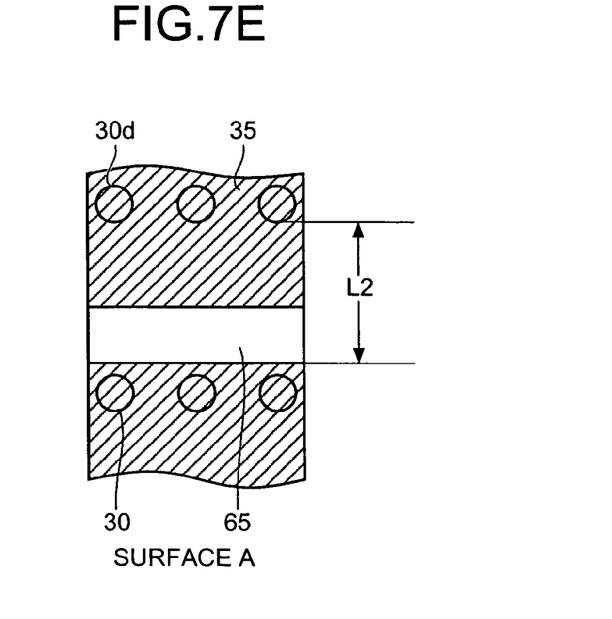
FIG. 7E is a plan view of details of the region corresponding to the section F in FIG. 7A and is a diagram of a state of the surface A of the multilayer dielectric substrate shown in FIG. 4.
Figure 7F:
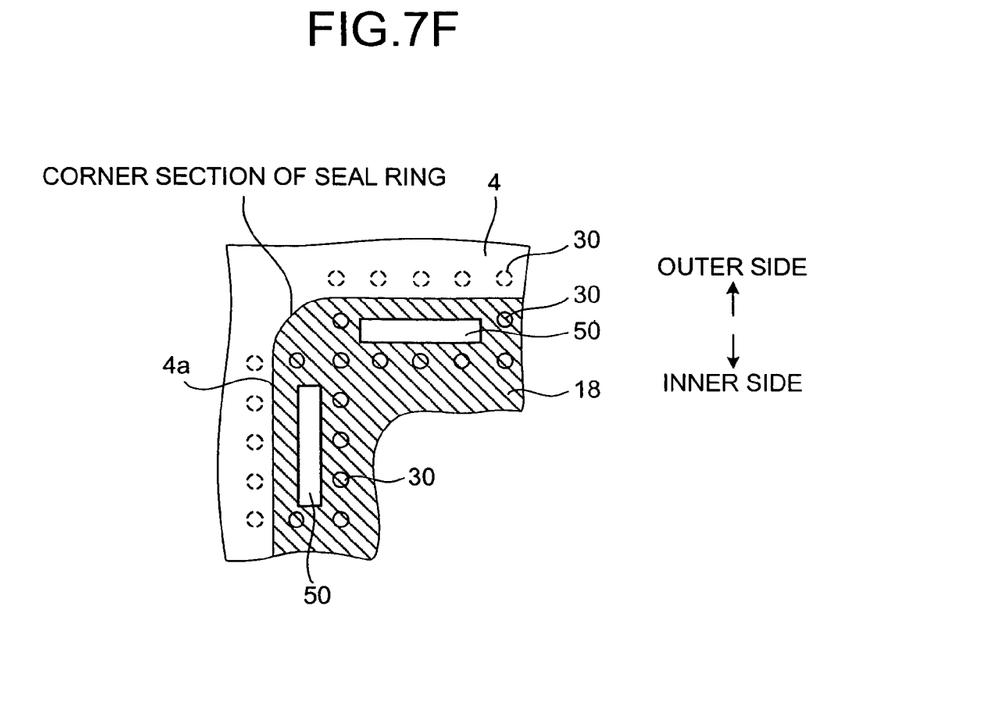
FIG. 7F is a plan view of details of a part in the multilayer dielectric substrate and is a diagram of another example of the surface structure of the multilayer dielectric substrate shown in FIG. 4.

FIGS. 7A to 7F are plan views of the coupling opening 65 and the resistor 70 formed in the multilayer dielectric substrate 2 shown in FIG. 4. FIG. 7A is a plan view of a state of a part of a surface A (corresponding to a surface A in FIG. 4; a fourth layer pattern and fourth layer vias) of the multilayer dielectric substrate 2. In particular, FIG. 7A depicts details of a section E shown in FIG. 3. FIG. 7B is a plan view of an example of a surface structure (corresponding to a surface D in FIG. 4) in the cavity 33 of the multilayer dielectric substrate 2. In particular, FIG. 7B depicts details of the section E shown in FIG. 3. FIGS. 7C to 7E depict details of a position corresponding to a section F in FIG. 7A. FIG. 7C is a plan view of a state of a surface layer (corresponding to an upper surface of the surface D in FIG. 4). FIG. 7D is a plan view of a state of a surface C (corresponding to a surface C in FIG. 4; a third layer pattern and third layer vias). FIG. 7E is a plan view of a state of the surface A (corresponding to the upper surface of the surface A in FIG. 4). FIG. 7F is a plan view of another structure of the openings 50 on the multilayer dielectric substrate 2 and depicts another example of the details of the section E shown in FIG. 3.

On the surface A (corresponding to the surface A in FIG. 4) shown in FIGS. 7A and 7E, the coupling opening 65 is formed in the inner-layer grounding conductor 35. The resistor 70 covers the coupling opening 65. The resistor 70 is not shown in FIG. 7E. FIG. 7A illustrates the inner-layer grounding conductor 35, the ground vias 30 on the inside constituting the dielectric transmission line 80, and the ground vias 30d constituting the end short-circuited point of the dielectric transmission line 80.

On the surface D (the surface layer) shown in FIGS. 7B and 7C, the grounding conductor 18 is brazed along the inner circumference of the seal ring 4, and the seal ring 4 is bonded to the grounding conductor 18. The surface layer inside the seal ring 4 is covered with the grounding conductor 18. The opening 50 is formed at the end of the cavity 33 of the grounding conductor 18. The ground vias 30 are arranged near the opening 50 in the grounding conductor 18 to form the impedance transformer 60 in a direction of stacking substrates toward lower layers. The opening 50 is provided over the entire circumference of the cavity 33 along the inner circumference of the seal ring 4.

On the surface C (corresponding to the surface C in FIG. 4) shown in FIG. 7D, the ground vias 30 are arranged with dielectrics therebetween, and thereby constitute the impedance transformer 60.

FIG. 7F depicts another form of the openings 50. In this example, the grounding conductor 18 is arranged at both ends of the openings 50 in a direction in which the openings 50 extend along the seal ring 4. The openings 50 are partially provided along the inner circumference of the seal ring 4. In this case, the openings 50 are arranged in positions other than corner sections of the seal ring 4.

As shown in FIG. 7, the coupling openings 65, the resistors 70, and the dielectric transmission lines 80 are formed in four directions around the IC mounting recess 6. Although not shown in the figure, the openings 50 and the impedance transformers 60 are formed in four directions around the IC mounting recess 6 in the same manner. These components (the opening 50, the impedance transformer 60, the coupling opening 65, the resistors 70, and the dielectric transmission line 80) can be continuously formed as shown in FIGS. 7A and 7B or can be formed separately in a plurality of sections as shown in FIG. 7F. The components can be provided, according to the mode of resonance of an object, on vertical or horizontal two sides, one vertical side and one horizontal side, or one vertical side or one horizontal side rather than on the entire inner circumference of the cavity 33 as shown in FIGS. 7A and 7B.

It is desirable that the opening 50 be located at a position spaced apart a length an integer times as long as about ½ of a wavelength of a signal wave from the periphery of the inner wall section of the seal ring 4 (the side end of the cavity 33) or the inner wall section of the seal ring 4 toward the center. This is to arrange, in waveguide connection of the cavity 33 and the impedance transformer 60, the connecting section, i.e., the opening 50, at a short-circuited point of a standing wave formed in the cavity 33. In other words, the optimum position of the opening 50 depends on a resonance mode of a signal band determined by dimensions of the seal ring 4, the cover 5, and the cavity 33 formed by the grounding conductors 18 in the surface layer. It is most effective to arrange the waveguide connecting section, i.e., the opening 50, at the short-circuited point of the standing wave generated by resonance.

Figure 8:
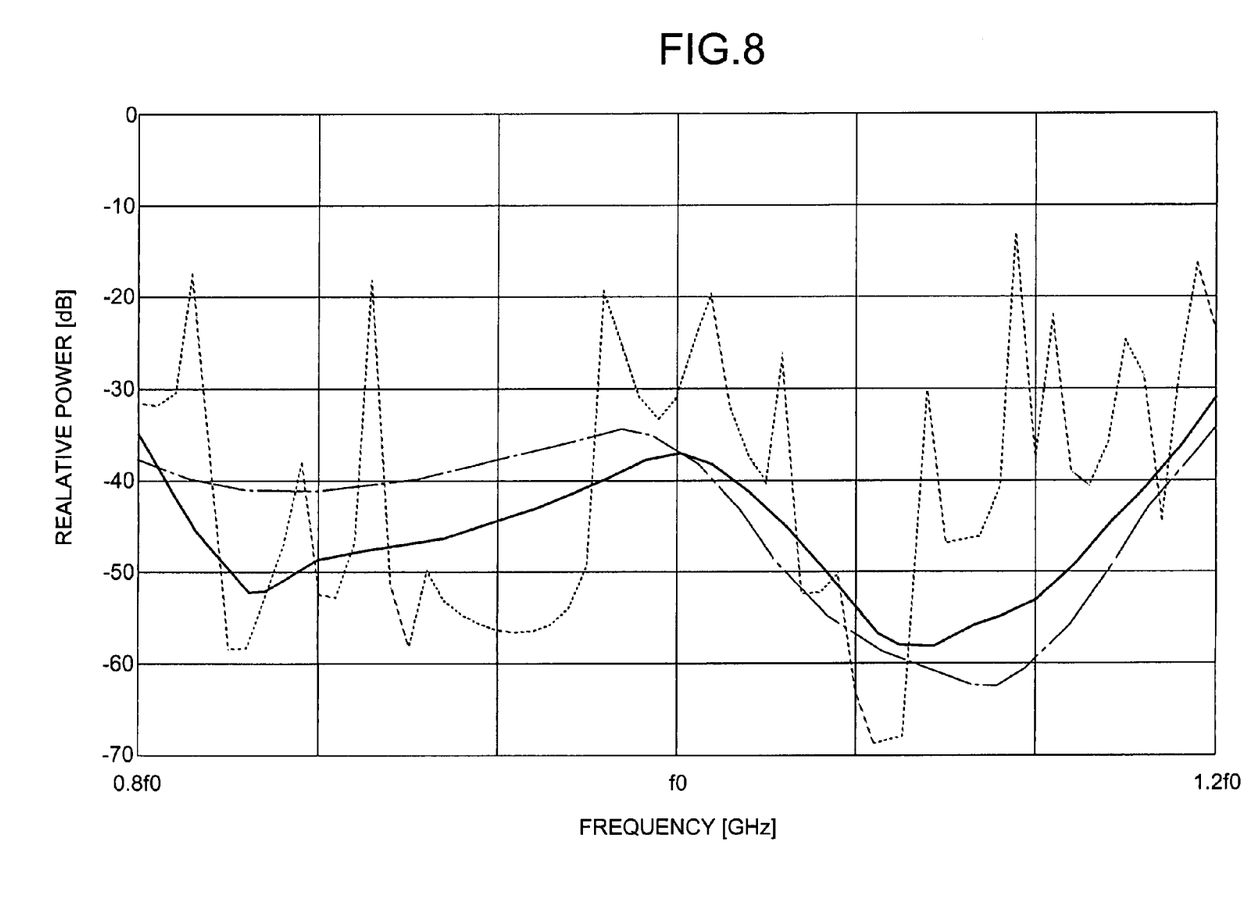
FIG. 8 is a graph of transmission characteristics in a cavity of the semiconductor package according to the first embodiment.

FIG. 8 is a graph of an isolation characteristic and the like in the cavity 33 according to the first embodiment. A solid line indicates an isolation characteristic according to the first embodiment, a broken line indicates that of the conventional technology in which the openings 50, the impedance transformers 60, the coupling openings 65, the resistors 70, and the dielectric transmission lines 80 according to the first embodiment are not provided, and an alternate long and short dashed line indicates a characteristic of an open state without the cover 5.

With respect to a desired frequency $f_0$, the open state without the cover 5 indicated by the alternate long and short dashed line is an ideal state in which there is no cavity resonance at frequencies of $0.8f_0$ to $1.2f_0$ and a semiconductor device and a transmission line operate stably. In the conventional technology not having the constitution according to the first embodiment, as indicated by the broken line, resonance of a high-order mode occurs and the isolation characteristic deteriorates steeply in a plurality of frequency domains. On the other hand, in the constitution according to the first embodiment indicated by the solid line, in a signal frequency band, it is possible to obtain an isolation characteristic that there is no cavity resonance and a semiconductor device and a transmission line operate stably as substantially the same in the state of the cover 5 being removed.

As described above, according to the first embodiment, impedance match from the cavity 33 to the resistor 70 is realized by the opening 50 of the surface-layer grounding conductor and the impedance transformer 60. The resistor 70 is arranged in parallel to an electric field at an open point with the maximum electric field of the dielectric transmission line 80, i.e., on the coupling opening 65. Thus, a terminating condition without an electric wall is simulatively created in the signal frequency band. Because of the terminating condition, a resonance mode is controlled as in the open state without the cover 5. An opening, a dielectric transmission line, and a resistor can be formed together during the manufacture of a multilayer dielectric substrate, which eliminates the need for secondary assembly work. Thus, it is possible to simplify manufacturing process, resulting in less cost. Moreover, an adhesive is not used in arranging the resistor, and an inert gas, which contaminates and erodes a high-frequency device, is not generated.

In the first embodiment, the length L2 of the dielectric transmission line 80 can be set to a length an odd number times as long as λg/4. Similarly, the length L1 of the impedance transformer 60 can be set to a length an odd number times as long as λg/4. In the first embodiment, the length of λg/4 of the dielectric transmission line 80 is set in the horizontal direction of the multilayer dielectric substrate 2 to ensure the length of λg/4 by one layer of the multilayer dielectric substrate 2. However, the length of λg/4 can be set in the thickness direction of the multilayer dielectric substrate 2.

A structure of the dielectric transmission line 80 is not limited to the rectangular dielectric waveguide formed in the vertical or the horizontal direction as shown in the example in the figures. The dielectric transmission line 80 can be a step-shaped dielectric waveguide or the like with via positions in respective layers of a dielectric substrate shifted from one another as long as the impedance relation and the necessary electric length from the end short-circuited position are secured.

Second Embodiment

Figure 9:
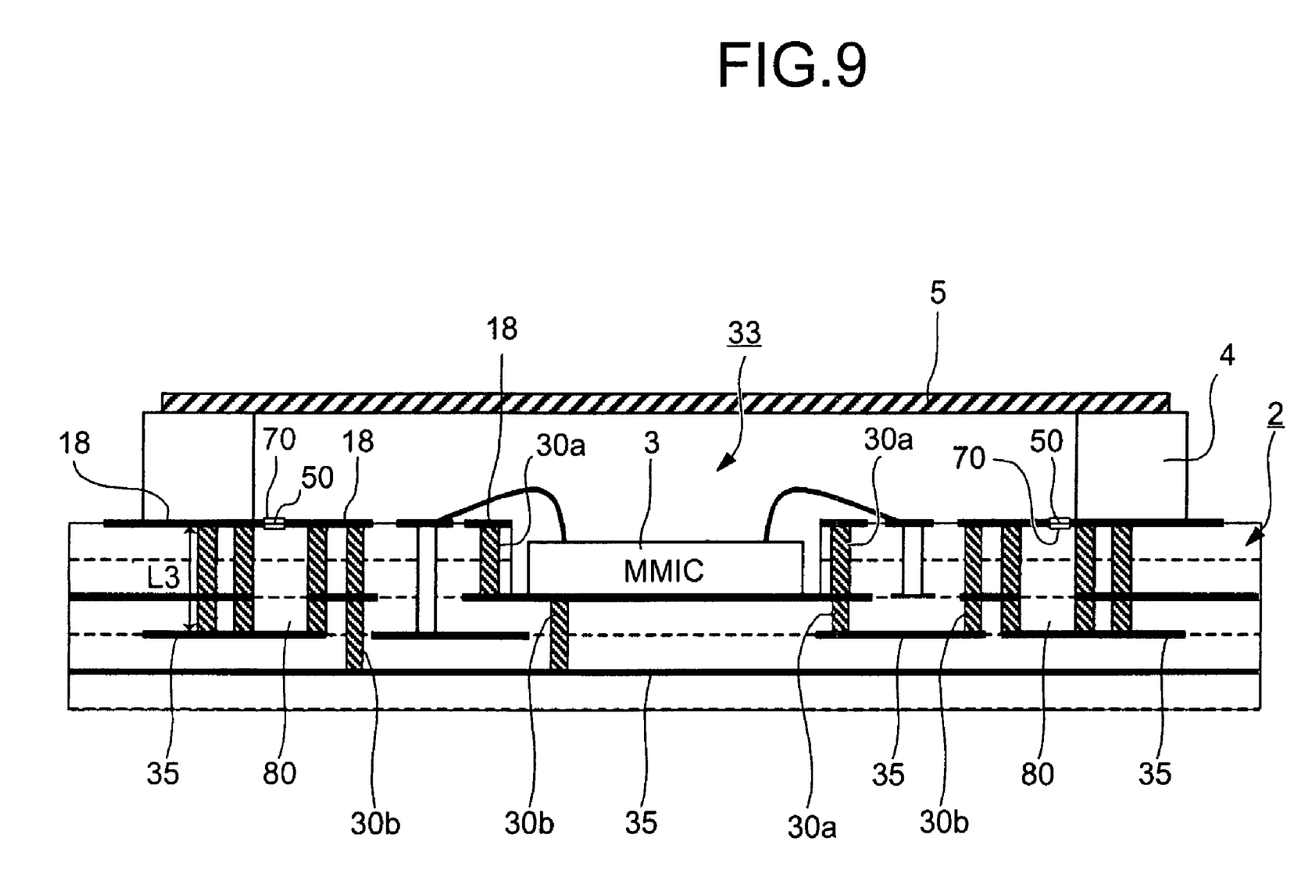
FIG. 9 is a detailed sectional view of an internal layer structure of a multilayer dielectric substrate of a semiconductor package according to a second embodiment of the present invention.

FIG. 9 is a diagram of a high-frequency package according to a second embodiment. In the second embodiment, the impedance transformers 60 of the first embodiment are removed.

In FIG. 9, each of the openings 50, i.e., a pattern removed from a ground, is formed at the cavity end of the ground pattern 18 as a surface-layer grounding conductor of the surface layer (the first layer) of the multilayer dielectric substrate 2 or the periphery of the end. The short-circuited-end dielectric transmission line 80 with a length of about ¼ of the in-substrate effective wavelength λg of a signal wave, which is electrically coupled with the cavity 33 via the opening 50, is formed in the multilayer dielectric substrate 2 beyond the opening 50. As in the first embodiment, the dielectric transmission line 80 includes the inner-layer grounding conductor 35, the ground vias 30, and dielectrics in the inner-layer grounding conductor 35 and the ground vias 30. However, in this case, a short-circuited point is formed by the inner-layer grounding conductor 35. The length λg/4 of the dielectric transmission line 80 is a depth (thickness) L3 from the opening 50 to the short-circuited-end inner-layer grounding conductor 35.

In the second embodiment, as in the first embodiment, a terminating waveguide coupled to the cavity 33 is formed to simulatively create a state equivalent to an open state without the cover 5. In the second embodiment, as in the first embodiment, the opening 50 is located at an open point with the maximum electric field and the resistor 70 is arranged in the opening 50 in parallel to an electric field forming surface. Thus, in a signal frequency domain, a terminating condition without an electric wall is simulatively created to suppress a resonance mode. An opening, a dielectric transmission line, and a resistor can be formed together during the manufacture of a multilayer dielectric substrate, which eliminates the need for secondary assembly work. Thus, it is possible to simplify manufacturing process, resulting in less cost. Moreover, an adhesive is not used in arranging the resistor, and an inert gas, which contaminates and erodes a high-frequency device, is not generated.

Third Embodiment

Figure 10:
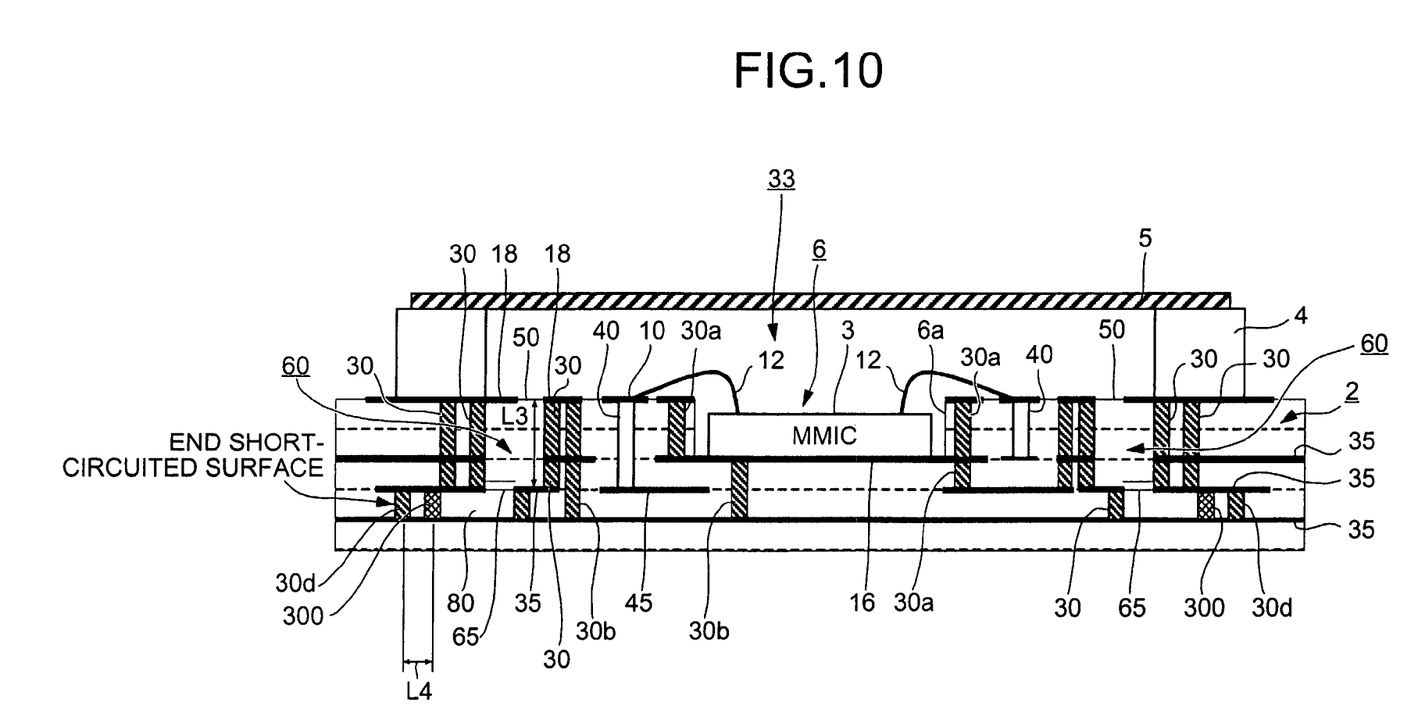
FIG. 10 is a detailed sectional view of an internal layer structure of a multilayer dielectric substrate of a semiconductor package according to a third embodiment of the present invention.

FIG. 10 is a diagram of a high-frequency package according to a third embodiment. In the third embodiment, a resistor is arranged in a direction of stacking layers of a dielectric substrate between the short-circuited-end ground via 30d and the coupling opening 65 of the first embodiment in the dielectric transmission line 80. In an example of FIG. 10, a resistor via array 300 filled with resistor material is arranged instead of a conductor.

In the third embodiment, a cavity-resonance control circuit including the opening 50, the impedance transformer 60, the coupling opening 65, the dielectric transmission line 80, and the resistor via array 300 is formed in the multilayer dielectric substrate 2.

Each of the openings 50, i.e., a pattern removed from a ground, is formed at the cavity end of the ground pattern 18 as a surface-layer grounding conductor of the surface layer (the first layer) of the multilayer dielectric substrate 2 or the periphery of the end. The impedance transformer 60 with a length of about ¼ of the in-substrate effective wavelength λg of a signal wave, which is electrically coupled to the cavity 33 via the opening 50, is formed in the multilayer dielectric substrate 2 beyond the opening 50. The length about λg/4 of the impedance transformers 60 is, as shown in FIG. 10, the distance L3 from the opening 50 to the coupling opening 65. The impedance transformer 60 includes the inner-layer grounding conductor 35, the ground vias 30, and dielectrics in the inner-layer grounding conductor 35 and the ground vias 30.

Each of the coupling openings 65, i.e., a pattern removed from a ground, is formed in the inner-layer grounding conductor 35 arranged at a position distant from the opening 50 by a length of about λg/4. The short-circuited-end dielectric transmission line 80 with an arbitrary length (longer than about ¼ of the in-substrate effective wavelength λg of the signal wave) is formed beyond the coupling opening 65. The dielectric transmission line 80 includes the inner-layer grounding conductor 35, the ground vias 30 and 30d, and dielectrics in the inner-layer grounding conductor 35 and the ground vias 30.

In the third embodiment, the resistor via array 300 filled with resistor material is provided between the ground via 30d forming an end short-circuited surface and the coupling opening 65. As shown in FIG. 10, the resistor via array 300 is arranged at a position distant by a length (L4) about ¼ of the in-substrate effective wavelength λg of the signal wave from the ground via 30d forming an end short-circuited surface in the dielectric transmission line 80. The position about λg/4 from an end short-circuited point of the dielectric transmission line 80 is, for the signal wave with the in-substrate effective wavelength λg, an open point where the electric field is maximized. Each of the resistor via arrays 300 is arranged at the open point in parallel to the electric field formed in the dielectric transmission line 80.

In the third embodiment, as in the first and second embodiments, a terminating waveguide coupled to the cavity 33 is formed to simulatively create a state equivalent to an open state without the cover 5. In the third embodiment, as in the first and second embodiments, impedance match from the cavity 33 to the resistor via arrays 300 is realized by the openings 50 of the surface-layer grounding conductors and the impedance transformers 60. The resistor via array 300 is arranged in parallel to an electric field at an opening point with the maximum electric field of the dielectric transmission line 80, i.e., on the coupling opening 65. Thus, a terminating condition without an electric wall is simulatively created in the signal frequency band to suppress a resonance mode. An opening, a dielectric transmission line, and a resistor can be formed together during the manufacture of a multilayer dielectric substrate, which eliminates the need for secondary assembly work. Thus, it is possible to simplify manufacturing process, resulting in less cost. Moreover, an adhesive is not used in arranging the resistor, an inert gas, which contaminates and erodes a high-frequency device, is not generated.

It is obvious that, in FIG. 10, as in the second embodiment, the impedance transformers 60 can be removed. In the third embodiment, the length L4 from the ground via 30d forming an end short-circuited surface to the resistor via array 300 can be set to a length an odd number times as long as λg/4. Similarly, the length L3 of the impedance transformer 60 can be set to a length an odd number times as long as λg/4. In the third embodiment, as in the first and second embodiments, the dielectric transmission line 80 can be formed in the thickness direction of the multilayer dielectric substrate 2.

In the embodiments described above, the present invention is applied to the high-frequency package configured to house the high-frequency devices 3 in the IC mounting recess 6 formed in the multilayer dielectric substrate 2. However, it is also possible to apply the present invention to a high-frequency package configured to mount the high-frequency devices 3 on a flat surface layer of the multilayer dielectric substrate 2 not having the IC mounting recess 6.

INDUSTRIAL APPLICABILITY

As described above, the multilayer dielectric substrate and the semiconductor package according to the present invention are suitably applied to semiconductor electronic devices such as an FM-CW radar that require measures against high-frequency electromagnetic interference (EMI).

The invention claimed is:

1. A multilayer dielectric substrate that includes a cavity on a dielectric substrate, and a semiconductor device in the cavity, the cavity being an electromagnetically shielded space, the multilayer dielectric substrate comprising:
    a grounding conductor that is a part of the electromagnetic shield, and covers substantially the entire dielectric substrate in the cavity;
    an opening that is located at a part of the grounding conductor;
    an impedance transformer that is located in the dielectric substrate, electrically connected to the cavity through the opening, and has a length an odd number times as long as about ¼ of an in-substrate effective wavelength of a signal wave;
    a dielectric transmission line with an end short that is located in the dielectric substrate, and has a length an odd number times as long as about ¼ of the in-substrate effective wavelength of the signal wave;
    a coupling opening that is located on an internal grounding conductor in a connecting section of the impedance transformer and the dielectric transmission line; and
    a resistor that is located on the coupling opening.

2. The multilayer dielectric substrate according to claim 1, wherein the opening is located at any one of a side end of the cavity and a position distant from the side end by a length an integer times as long as about ½ of a wavelength of the signal wave.

3. The multilayer dielectric substrate according to claim 1, wherein the opening, the impedance transformer, the dielectric transmission line, the coupling opening, and the resistor are located around where the semiconductor device is mounted.

4. The multilayer dielectric substrate according to claim 1, wherein the dielectric transmission line includes the internal grounding conductor, a plurality of ground via-holes, and dielectrics in the internal grounding conductor and the ground via-holes.

5. The multilayer dielectric substrate according to claim 1, wherein the impedance transformer includes the internal grounding conductor, a plurality of ground via-holes, and dielectrics in the internal grounding conductor and the ground via-holes.

6. A semiconductor package comprising:
    the multilayer dielectric substrate according to claim 1; and
    an electromagnetic shielding member that forms the cavity.

7. A semiconductor package comprising:
    a semiconductor device;
    the multilayer dielectric substrate according to claim 1 that includes thereon the semiconductor device; and
    an electromagnetic shielding member that forms the cavity for housing the semiconductor device.

* * * * *